(12) United States Patent
Mayerhofer et al.

(10) Patent No.: US 9,159,719 B2
(45) Date of Patent: Oct. 13, 2015

(54) ESD PROTECTION

(71) Applicant: Infineon Technologies AG, Neubiberg (DE)

(72) Inventors: Michael Mayerhofer, Deisenhofen (DE); Andrei Cobzaru, Bucharest (RO); Adrian Finney, Villach (AT); Ulrich Glaser, Putzbrunn (DE); Gilles Guerrero, Villach (AT); Bogdan-Eugen Matei, Bucharest (RO); Markus Mergens, Kirchseeon (DE)

(73) Assignee: Infineon Technologies AG, Neubiberg (DE)

( * ) Notice: Subject to any disclaimer, the term of this patent is extended or adjusted under 35 U.S.C. 154(b) by 246 days.

(21) Appl. No.: 13/951,157

(22) Filed: Jul. 25, 2013

(65) Prior Publication Data

US 2014/0029145 A1 Jan. 30, 2014

(30) Foreign Application Priority Data

Jul. 26, 2012 (DE) .......................... 10 2012 014 860

(51) Int. Cl.
*H02H 9/00* (2006.01)
*H01L 27/02* (2006.01)

(52) U.S. Cl.
CPC ..... *H01L 27/0255* (2013.01); *H01L 2924/0002* (2013.01)

(58) Field of Classification Search
CPC .................................................. H01L 27/0266
USPC ............................................................ 361/56
See application file for complete search history.

(56) References Cited

U.S. PATENT DOCUMENTS

| 5,691,557 | A | 11/1997 | Watanabe |
| 6,172,383 | B1 | 1/2001 | Williams |
| 6,229,180 | B1 | 5/2001 | Yoshida et al. |
| 6,353,237 | B1 * | 3/2002 | Yu ................................. 257/173 |
| 6,762,461 | B2 | 7/2004 | Kawamoto |
| 7,012,307 | B2 * | 3/2006 | Lin et al. ........................ 257/360 |
| 7,768,034 | B2 * | 8/2010 | Calafut et al. ................ 257/173 |
| 2003/0228848 | A1 | 12/2003 | Escoffier et al. |
| 2008/0087963 | A1 | 4/2008 | Calafut et al. |

FOREIGN PATENT DOCUMENTS

| CN | 1659705 A | 8/2005 |
| CN | 101819972 A | 9/2010 |
| DE | 102004045467 A1 | 3/2006 |

* cited by examiner

*Primary Examiner* — Stephen W Jackson
(74) *Attorney, Agent, or Firm* — Murphy, Bilak & Homiller, PLLC

(57) ABSTRACT

A two-stage protection device for an electronic component protects against transient disturbances. The electronic component may be a semiconductor component, and may include one or multiple transistors and/or an integrated circuit. The protection device is connected to at least a first contact and a second contact of the electronic component, and is disposed essentially in parallel to the component that is to be protected, between the first contact and the second contact. The protection device includes a first stage with at least one diode and a second stage separated from the first stage by a resistor. The second stage includes at least one diode arrangement having two back-to-back disposed diodes which are disposed cathode-to-cathode.

15 Claims, 3 Drawing Sheets

ESD PROTECTION

PRIORITY CLAIM

This application claims priority to German Patent Application No. 10 2012 014 860.7, filed on 26 Jul. 2012, the content of said German application incorporated herein by reference in its entirety.

TECHNICAL FIELD

The present disclosure relates to protection against electrostatic transient disturbances, often also referred to as ESD (electrostatic discharge) protection, which may be particularly used with electronic semiconductor components and integrated circuits.

BACKGROUND

Semiconductor components are often provided with protection against transient disturbances to avoid damage to the semiconductor components that may result from high voltage pulses and/or high current pulses, which pulses may arise from an electrostatic charge. An example of such transient disturbances is ESD pulses. Various one- or two-stage systems are known for protecting against ESD pulses. Two-stage systems usually have a first stage that can accommodate high currents but that has a high voltage drop. In order to protect sensitive components, a second stage is therefore provided which is closer to the component that is to be protected; this second stage can accommodate substantially lower currents than the first stage, but has a lower voltage drop.

SUMMARY

According to an embodiment, a device includes a two-stage protection device for protecting an electronic component against transient disturbances. Transient disturbances may be electrical current or voltage pulses. Examples of transient disturbances are: electrostatic discharge (ESD) pulses; disturbances related to a switching action (on and/or off); etc. The electronic component may be a semiconductor component, and may contain one or more transistors and/or an integrated circuit. The protection device is connected to at least a first contact and one second contact of the electronic component and is disposed essentially in parallel to the component that is to be protected, between the first contact and the second contact. The protection device includes at least one first stage with at least one diode and a second stage which is separated from the first stage by at least one resistor. The second stage includes at least one diode arrangement having at least two back-to-back disposed diodes which are disposed cathode-to-cathode.

The at least two in series disposed diodes in the second stage may be polysilicon diodes, disposed in a p-n-p configuration. In this way, a protection device may be economically implemented directly on the semiconductor substrate of the semiconductor component, which, for example, has low drift sensitivity. A p+/n−/p+ doping may be advantageous.

According to another embodiment, a device for protection of electronic components against transient disturbances is provided. The protection device is electrically connected in parallel with at least a first contact and a second contact of the electronic component, and includes a diode arrangement with at least two back-to-back disposed polysilicon diodes. The electronic component may be a semiconductor component, and the at least two back-to-back disposed diodes may be implemented in a silicon substrate of the semiconductor component, wherein the diodes are disposed in a p-n-p configuration. In the p-n-p configuration, the back-to-back disposed polysilicon diodes are disposed anode-to-anode.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
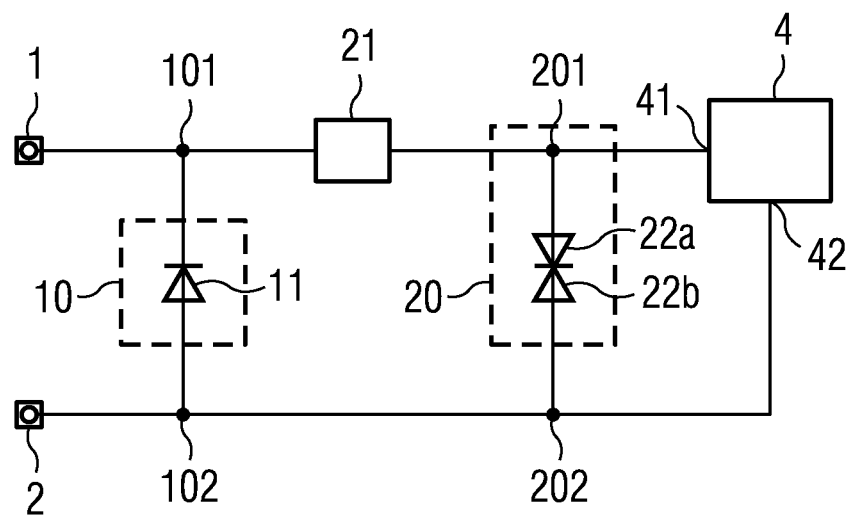
FIG. 1 illustrates a first embodiment of an ESD protection device.

The present disclosure will become more clear upon reading the following description of examples of the disclosure, which are presented solely for purposes of example and do not limit the scope of the disclosure in any way, and are given with reference to the accompanying drawings. Same reference numerals are used for the same or similar features.

FIG. 1 illustrates an example of a protection device for protection against voltage and/or current pulses. These pulses may occur at the connecting terminals in the event of an electrostatic discharge or through processes of switching on or off of electronic components 4 or external components. The description of the embodiment and figures relates to protection against ESD pulses and ESD voltages. It should be apparent to one skilled in the art that the described protection is also applicable to any other type of transient disturbances in the form of voltage and/or current pulses, and is not limited to ESD pulses.

The protection device may be used with any electronic circuit or component, but is particularly advantageous for protection of semiconductor components 4. The semiconductor component 4, which is to be protected, may be e.g. a single transistor, a circuit including multiple semiconductor components, or an integrated circuit. Collectively these semiconductor components which are to be protected will be referred to as the semiconductor component or simply component 4. All of the semiconductor components 4 to be protected have at least two electrical terminals or contacts, a first contact 41 and a second contact 42, between which the transient disturbances can occur, for example, if these two contacts 41, 42 extend directly to the exterior and if, for example, a person comes into contact with one of these contacts 41, 42. In the case of an integrated circuit, these two contacts may include, for example, an input as the first contact 41 and ground as the second contact 42. In the case of one or more field effect transistors which are to be protected, the first contact 41 may be the gate terminal and the second contact 42 may be the drain terminal. In a case (not illustrated) in which no ESD protection is provided, the first contact 41 of the component 4 is directly connected to the connector panel or connecting terminal 1 and the second contact 42 of the component 4 is directly connected to the connector panel or connecting terminal 2. The first connector panel or connecting terminal 1 and the second connector panel or connecting terminal 2 form the external connection or electrical contact with which the component 4 can be contacted and connected from the exterior.

In order to protect the component 4 against damaging high voltages and/or currents, a so-called electrostatic discharge (ESD) protection is provided as a protection device which is connected upstream of the component 4, between the first connecting terminal 1 and the second connecting terminal 2. Conventionally, one of the electrical contacts, the second contact 42, is at ground potential and the other contact, the first contact 41, is connected to the input of the semiconductor component 4. In the case of a field effect transistor, the first contact 41 can be, for example, the gate terminal, in order to protect the gate oxide against too high voltages which may damage or destroy the field effect transistor. Here, the first connecting terminal 1 and the second connecting terminal 2 provide the external connection or contact whereby the component 4 and the protection device are contacted and connected from the exterior.

The protection device includes a first stage 10 with a first electrical connection 101 and a second electrical connection 102. The first connection 101 of the first stage 10 electrically connects one side of the first stage 10 with the first connecting terminal 1. The second connection 102 electrically connects a second side of the first stage 10 with the second contact 42 of the component 4 which is to be protected and to the second connecting terminal 2. In the simplest case, the first stage 10 has a single diode 11 which has its breakdown voltage at a prescribed protection voltage. If, for example, by reason of an electrostatic charge, a higher voltage occurs on the first connecting terminal 1 or on the first contact 41, with respect to the second contact 42 or the second connecting terminal 2, the diode 11 breaks down and conducts current from the first connecting terminal 1 to the second connecting terminal 2. In addition to a single diode 11, various arrangements are known, for example having multiple diodes, which can be combined with the present disclosure. The first stage 10 is designed to accommodate high current intensities, but with an elevated voltage drop, at least if no countermeasures are employed for reduction and control of the voltage.

The protection device according to FIG. 1 includes a second stage 20 in addition to the first stage 10. The second stage 20 has a first electrical connection 201 and a second electrical connection 202 for electrical connection of the second stage 20 with the component 4 which is to be protected, wherein the second stage 20 is connected in parallel with the component 4. On the first contact 41 at the input side, the second stage 20 is separated from the first stage 10 by a resistor 21, i.e. the resistor 21 is disposed between the first connection 101 of the first stage 10 and the first connection 201 of the second stage 20. The first electrical connection 201 of the second stage 20 is directly connected to the input (the first contact 41) of the component 4 to be protected. On the other side, the second connection 202 of the second stage 20 is directly connected to the second connection 102 of the first stage 10.

The second stage 20 can accommodate lower current intensities than the first stage 10, but provides a lower voltage drop. At least the second stage 20, but optionally also the first stage 10, may be integrated into the semiconductor component 4, and thus may be disposed on the same semiconductor substrate or in the same chip. In this way the ESD protection is better integrated and is less expensive to fabricate.

The second stage 20 may include at least two back-to-back disposed or connected diodes 22a and 22b, in order to be able to provide protection against electrostatic discharge in both directions. This is achieved by an opposite (back-to-back) arrangement of two back-to-back disposed diodes 22a, 22b. The back-to-back disposed diodes 22a, 22b are arranged with the cathodes directed toward each other. This can also provide effective protection with a defined turn-on and breakdown voltage, against over-voltages with opposite polarities, which can be desirable particularly in cases in which the second terminal 2 is not connected to the ground. The back-to-back diodes 22a, 22b can be realized with a p/n/p arrangement 22 of polysilicon diodes on a single silicon substrate and in an inexpensive manner. For an inexpensive and compact implementation, the p/n/p arrangement 22 of polysilicon diodes may be disposed and integrated on the same silicon substrate as the semiconductor component 4 which is to be protected.

Figure 2:
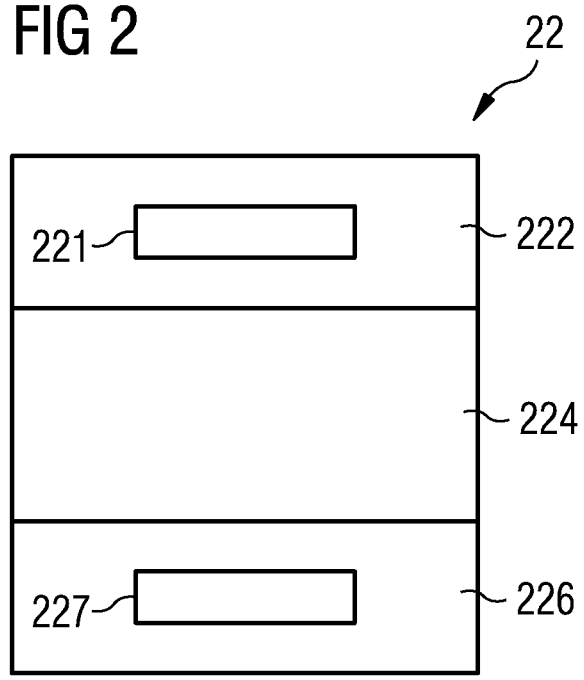
FIG. 2 illustrates an embodiment of a p/n/p diode.

For example, a p/n/p arrangement 22 of polysilicon diodes may be implemented as p+/n−/p+ back-to-back polysilicon diodes as illustrated in FIG. 2. This arrangement is less sensitive to drift, even when stressed in a reverse direction. FIG. 2 is a plan view of a region of the semiconductor in which the p+/n−/p+ back-to-back polysilicon diode is implemented. Between a first p-doped region 222 and a second p-doped region 226, an n-doped region 224 is provided, as a floating region. The first p-doped region 222 has a first contact region 221 which is electrically directly connected, i.e. essentially without any increased electrical resistance, to the first input contact 41 of the component 4 that is to be protected (see FIG. 1). The second p-doped region 226 is connected via a second contact region 227 in the example according to FIG. 1 to the second connection 202 of the second stage 20 and thereby to the second contact 42 of the component 4 that is to be protected. In the simplest case, this electrical connection can be accomplished without interposition of additional components. However, other components may be provided, for example one or more forward-biased diodes, as will be described below. In addition to the illustrated p/n/p arrangement 22 of polysilicon diodes, additional diodes or other components may be disposed, as will be described below.

Figure 3A:
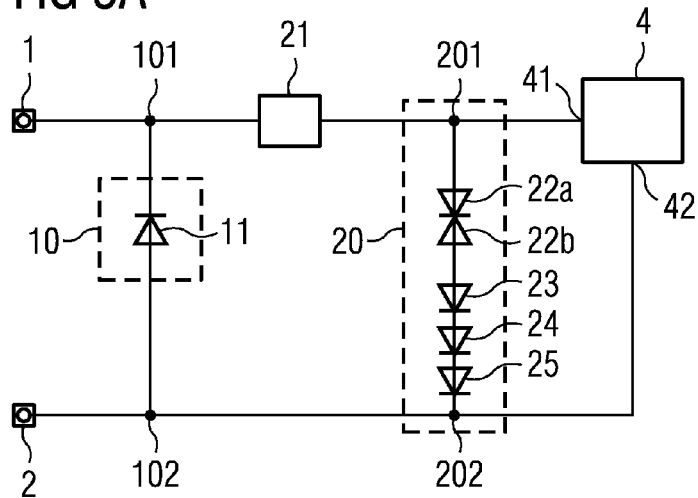
FIGS. 3A and 3B illustrate a second embodiment of an ESD protection device.
Figure 3B:
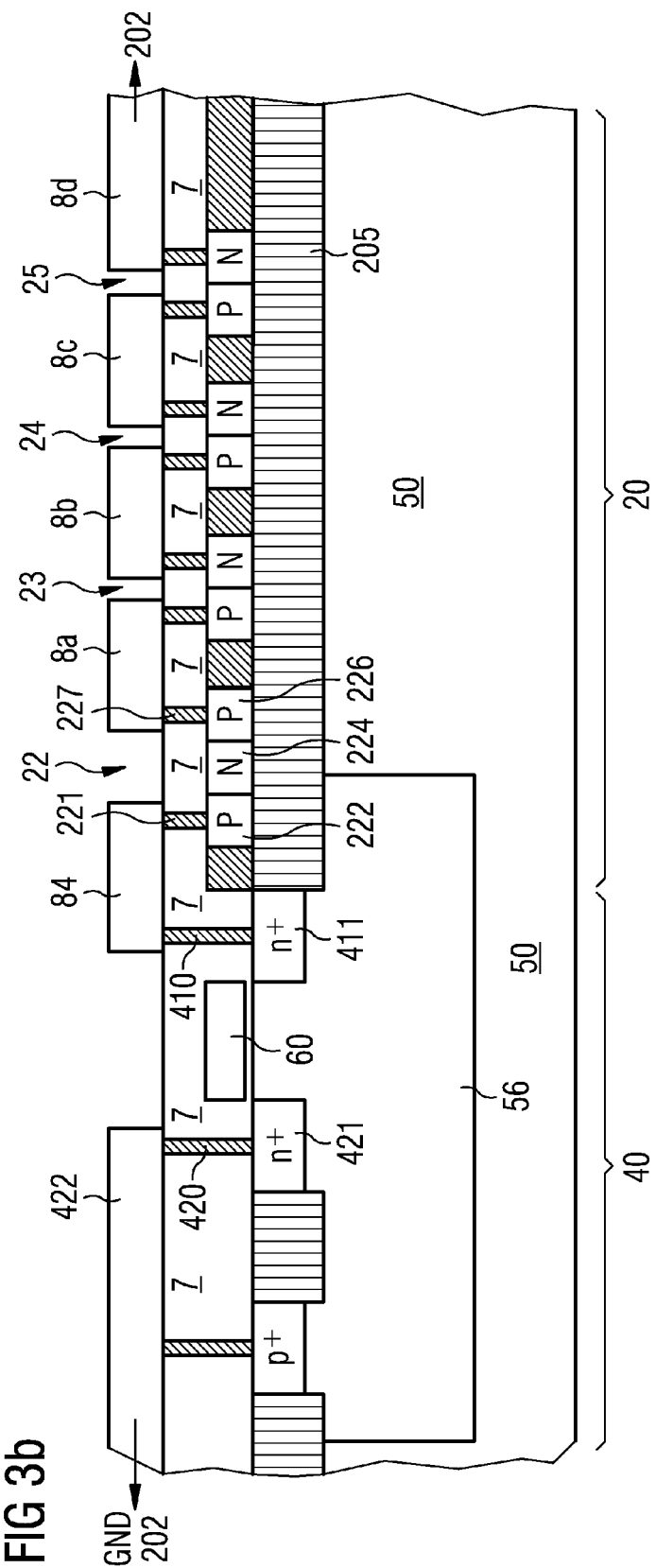

FIGS. 3A and 3b illustrate another embodiment of the protection device. This embodiment corresponds to the embodiment according to FIG. 1, with additional one or more forward voltage drop diodes 23, 24, 25 connected successively in the forward direction, in series, in addition to the two back-to-back disposed diodes 22a, 22b in p+/n−/p+ back-to-back disposition of FIG. 1. With the additional forward voltage drop diodes 23, 24, 25, the leakage current can be reduced, and the turn-on voltage can be set more precisely.

In FIG. 3A first, second, and third forward voltage drop diodes 23, 24, 25 are illustrated, for purposes of example. However, there can be only one forward voltage drop diode or any desired number of forward voltage drop diodes connected in series, in order to further reduce the leakage current and to set the turn-on voltage more precisely. Advantageously, the forward voltage drop diodes 23, 24, 25 are disposed between an anode of the two back-to-back disposed diodes 22a, 22b and the second connection 202 of the second stage 20. With this arrangement, the other anode of the two back-to-back disposed diodes 22a, 22b remains in direct electrical contact with the first contact 41 of the component that is to be protected, as described above with reference to FIG. 1. The forward voltage drop diodes 23, 24, 25 are disposed in the forward direction such that they allow an electric current to pass towards the second connection 202 of the second stage 20.

Diode 22a of the p+/n-/p+ diode is on its anode side in direct electrical contact, thus with essentially no electrical resistance, with the first terminal 41 of the semiconductor component 4 that is to be protected. In the case of a field effect transistor, this is normally the gate terminal.

The forward voltage drop diodes 23, 24, 25 may also be in the form of polysilicon diodes and can be implemented in the silicon substrate of the semiconductor component 4 that is to be protected, as shown in the cross-sectional view of FIG. 3b in the case of the example of a MOSFET 40 as the semiconductor component 4. Directly next to the MOSFET 40, the second stage 20 of the protection device is implemented in the same substrate 50 as the MOSFET 40. The substrate 50 may consist of doped silicon. The MOSFET 40 may be a customary MOSFET or a different semiconductor component. In the example illustrated, a drain region 411 is connected via a drain terminal or drain contact 410, as the first contact 41, with the first contact region 221 of the p/n/p arrangement 22 of the polysilicon diodes of the second stage 20, via a plating 84 such as a structured metal layer. In his way, the plating 84 may form the first connection 201 of the second stage 20, and in addition may be in electrical contact with the resistor 21 (not shown in FIG. 3b). The MOSFET 40 also has a gate 60, a body region 56, and a source region 421 which is connected via a contact region 420 to a plating 422. In this example, the contact region 420 forms the second contact 42 of the component 4, is connected to the second connection 202 of the second stage 20, and may be at ground potential (GND).

Instead of or in addition to the drain region 411, a gate or a source region may be connected, as a first contact, to the first contact region 221 of the p/n/p arrangement 22 of polysilicon diodes of the second stage 20.

The second stage 20 has an insulation layer 205 which may be in the form of trench isolation (STI) and which in the example shown is disposed next to the drain region 411. On the insulation layer 205, the two back-to-back disposed diodes 22a, 22b of the p/n/p arrangement 22 of the polysilicon diodes and the forward voltage drop diodes 23, 24, 25 of the second stage 20 are disposed, by means of a suitable arrangement of p- and n-doped regions. The forward voltage drop diodes 23, 24, 25 are connected to each other and to the anode of diode 22b of the p+/n-/p+ diode by platings 8a, 8b, 8c, 8d, which are not connected to each other. The other anode, of diode 22a of the p+/n-/p+ diode 22, is directed toward the semiconductor component 4.

As illustrated in FIG. 3b, the entire second stage 20, and optionally also the first stage 10 (not shown) can be integrated into the semiconductor component 4, which enables inexpensive fabrication.

Figure 4:
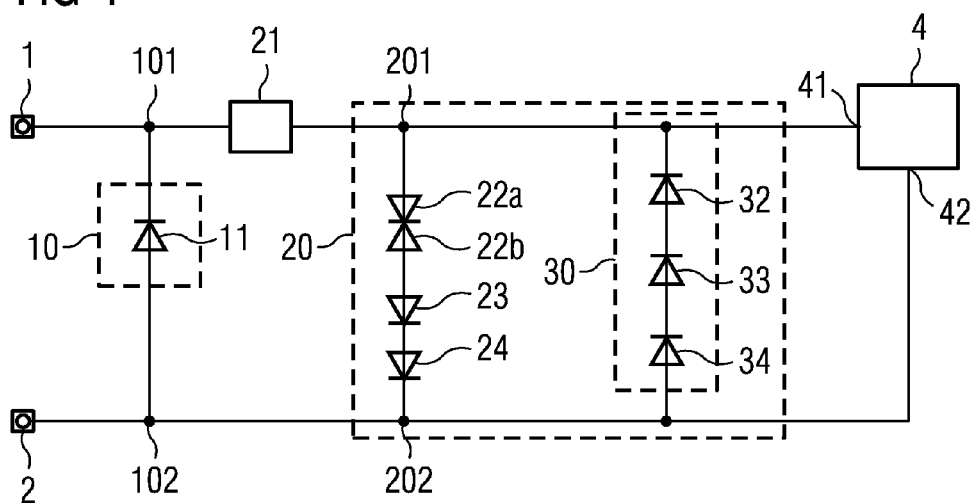
FIG. 4 illustrates a third embodiment of an ESD protection device.

FIG. 4 illustrates another embodiment of the present disclosure. The embodiment corresponds to the embodiment of FIG. 3A, with the difference being that the second stage 20 has a second parallel branch 30 with one or more forward-biased diodes 32, 33, 34. These diodes 32, 33, 34, in contrast to the forward voltage drop diodes 23, 24 connected in series with the back-to-back disposed diodes 22a, 22b, are directed in the opposite direction. The forward direction is directed from the second connection 202 towards the first connection 201 of the second stage 20 and thereby from the second terminal 42 to the first terminal 41 of the component 4. With this arrangement, one can effectively bleed off or deviate ESD voltages also with negative polarity with respect to the ground potential (or terminal 2). Leakage current can also be reduced by using multiple in series-connected diodes 32, 33, 34 in the second parallel branch 30. Additionally, the number of diodes in the second parallel branch 30 may be chosen such that in normal operation one has a higher breakdown voltage than in the path over the two back-to-back disposed diodes 22a, 22b, and such that in reverse operation the in series-connected diodes 32, 33, 34 in the second parallel branch 30 have a lower voltage. While FIG. 4 shows three diodes 32, 33, 34 connected in series in the second parallel branch 30, the number of such diodes may be any desired number which suits the requirements.

The diodes of the parallel branch 30 may be fabricated as polysilicon diodes and can be implemented in the substrate of the semiconductor component 4 that is to be protected. In this way, also in this case the entire second stage 20 and optionally also the first stage 10 can be fabricated integrally in the silicon substrate of the semiconductor component 4, which enables inexpensive fabrication.

While the parallel path or branch 30 in FIG. 4 is shown in connection with the two forward voltage drop diodes 23, 24 in this embodiment, it is also possible to combine the parallel branch 30 of one or more forward-biased diodes 32, 33, 34 with the embodiment according to FIG. 1 or the embodiment according to FIG. 3A.

Figure 5:
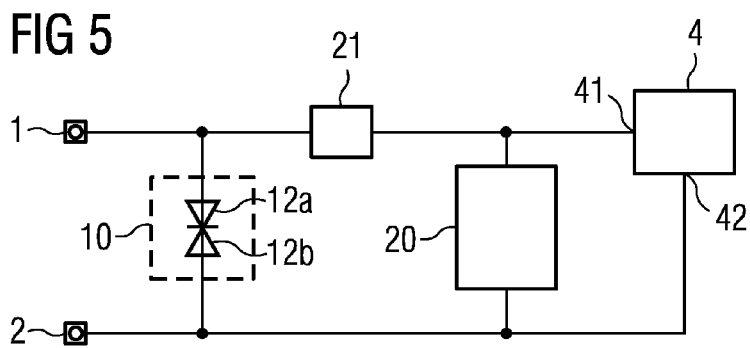
FIG. 5 illustrates another embodiment of an ESD protection device.

Another embodiment of the present disclosure is illustrated in FIG. 5. In this embodiment, the first stage 10 has also two back-to-back disposed diodes 12a, 12b. The two back-to-back disposed diodes 12a, 12b of the first stage 10 may also be realized as p+/n-/p+ polysilicon diodes in a back-to-back arrangement, as described for the second stage 20 with reference to FIGS. 1 and 2. In this way one may provide also in the first stage 10 an inexpensive ESD protection for sensitive components 4. The two back-to-back disposed diodes 12a, 12b of the first stage 10 may also be disposed in the same silicon substrate and implemented in the same component 4. In addition to the provision of two additional back-to-back disposed diodes 12a, 12b in the first stage 10 and in addition to the above-described two back-to-back disposed diodes 22a, 22b in the second stage 20, it is also possible to provide the two back-to-back disposed diodes 12a, 12b in the first stage 10 alone. This may be sufficient if a single stage system 10 already provides sufficient protection against electrostatic discharges.

The examples and combinations illustrated and described herein are purely exemplary, and features of one embodiment may be combined with features of other embodiments, unless explicitly excluded. A person skilled in the art will recognize additional possibilities for combinations, for combining two back-to-back disposed diodes, particularly in the form of p+/n-/p+ polysilicon diodes, in the first and/or second stage. For example, one may implement only the second stage in the component that is to be protected, with the first stage being provided as a separate component. It is equally possible to provide the described ESD protection arrangements or one or more of the p+/n-/p+ polysilicon diodes as a separate component, which can then be connected to any component that is to be protected.

The first connection 101 and second connection 102 of the first stage 10, as well as the first connection 201 and the second connection 202 of the second stage 20, and the possibly additional connections 301 and 302 of the branch 30 represent internal electrical connections, nodes, or terminals, which serve for electrical connection within the protection device. It is not necessary for the use of the device according to the present disclosure that these connections be accessible and contactable from the exterior. The contacting from the exterior occurs via the connector panels or terminals 1 and 2.

The terms "parallel" and "in series" (or "serial") always relate to the electrical configuration, unless stated explicitly otherwise. The geometric arrangement can vary. The examples which are illustrated are not to scale.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A protection device for protection against transient disturbances, the protection device configured for electrical connection to at least a first contact and a second contact of an electronic component, the protection device comprising:
   a first stage with at least one diode, the first stage being connected to at least one terminal; and
   a second stage separated from the first stage by a resistor and directly connected to the first contact and to the second contact, the second stage being adapted for smaller current than the first stage and comprising at least one diode arrangement including two back-to-back polysilicon diodes, the two back-to-back polysilicon diodes being disposed cathode-to-cathode in a p-n-p configuration comprising a floating n-type area between a first p-type area and a second p-type area.

2. The protection device of claim 1, wherein one anode of the two back-to-back polysilicon diodes is connected to the first contact of the electronic component by a connection having essentially zero resistance.

3. The protection device of claim 1, wherein the electronic component is a silicon semiconductor component having a silicon substrate and the two back-to-back polysilicon diodes are disposed on the silicon substrate.

4. The protection device of claim 1, wherein the at least one diode arrangement further comprises one or more additional diodes disposed in series with the two back-to-back polysilicon diodes.

5. The protection device of claim 1, wherein the at least one diode arrangement further comprises a plurality of additional diodes directed in a common direction with respect to each other and disposed in series with the two back-to-back polysilicon diodes.

6. The protection device of claim 1, wherein the second stage further comprises one or more additional diodes disposed in parallel to the two back-to-back polysilicon diodes between the first contact and the second contact of the electronic component.

7. The protection device of claim 6, wherein each additional diode disposed in parallel to the two back-to-back polysilicon diodes is oriented in the forward direction towards the first contact.

8. The protection device of claim 6, wherein each additional diode disposed in parallel to the two back-to-back polysilicon diodes is a polysilicon diode.

9. The protection device of claim 1, wherein the first stage comprises at least two back-to-back polysilicon diodes disposed in a p-n-p configuration comprising a floating n-type area between a first p-type area and a second p-type area.

10. A protection device for protection against transient disturbances, the protection device configured for connection in parallel to at least a first contact and a second contact of a semiconductor electronic component, the protection device comprising:
    a diode arrangement including at least two back-to-back polysilicon diodes,
    wherein the at least two back-to-back polysilicon diodes are implemented on a silicon substrate of the semiconductor electronic component in a p-n-p configuration,
    wherein the at least two back-to-back diodes comprise a floating n-type area between a first p-type area and a second p-type area.

11. An ESD protection device, comprising:
    a first stage comprising a first electrical connection point, a second electrical connection point and a first diode between the first and second electrical connection points;
    a second stage comprising a first electrical connection point, a second electrical connection point and a diode arrangement including two back-to-back polysilicon diodes between the first and second electrical connection points of the second stage, the two back-to-back polysilicon diodes being disposed cathode-to-cathode in a p-n-p configuration; and
    a resistor connecting the first electrical connection point of the first stage to the first electrical connection point of the second stage,
    wherein the second electrical connection point of the second stage is directly connected to the second electrical connection point of the first stage.

12. The ESD protection device of claim 11, wherein the diode arrangement further comprises one or more additional diodes disposed in series with the two back-to-back polysilicon diodes.

13. The ESD protection device of claim 11, wherein the diode arrangement further comprises a plurality of additional diodes directed in a common direction with respect to each other and disposed in series with the two back-to-back polysilicon diodes.

14. The ESD protection device of claim 11, wherein the second stage further comprises one or more additional diodes disposed in parallel to the two back-to-back polysilicon diodes between the first and second electrical connection points of the second stage.

15. The ESD protection device of claim 11, wherein the first stage further comprises an additional diode disposed cathode-to-cathode in a p-n-p configuration with the first diode of the first stage.

* * * * *